United States Patent [19]

Knickerbocker et al.

[11] Patent Number: 4,585,290
[45] Date of Patent: Apr. 29, 1986

[54] MODULAR TEST PLUG ADAPTER

[75] Inventors: Robert H. Knickerbocker, Cheshire; Stephen M. Thomas, Torrington, both of Conn.

[73] Assignee: The Siemon Company, Watertown, Conn.

[21] Appl. No.: 634,816

[22] Filed: Jul. 26, 1984

[51] Int. Cl.⁴ .......................................... H01R 27/00
[52] U.S. Cl. .......................... 339/97 R; 339/156 R; 339/192 R
[58] Field of Search .................................. 339/97–99, 339/107, 154–159, 166–170, 191, 192, 207, 208

[56] References Cited

U.S. PATENT DOCUMENTS

| 1,777,312 | 10/1930 | Keene | 339/208 |
| 2,027,853 | 1/1936 | Benander | 339/110 P |
| 3,569,900 | 3/1971 | Uberbacker | 339/107 |
| 4,088,384 | 5/1978 | Gumb | 339/156 R |
| 4,290,664 | 9/1981 | Davies | 339/156 R |
| 4,295,702 | 10/1981 | Snyder | 339/154 R |
| 4,362,905 | 12/1982 | Ismail | 339/159 R |

FOREIGN PATENT DOCUMENTS 2856549 7/1979 Fed. Rep. of Germany .... 339/97 R

Primary Examiner—Neil Abrams
Attorney, Agent, or Firm—Fishman & Dionne

[57] ABSTRACT

A modular test plug adapter for insertion directly on a telephone terminal block of the type having a plurality of connectors extending therefrom (i.e., 66 type terminals) is presented. The test plug adapter is comprised of a compact insulative housing having a plurality of apertures therethrough, each aperture leading to a cavity having a bridge clip therein. The bridge clips are preferably quick connect type bridge clips and are connected via wire conductors to a standard modular jack for accessing test phones or other test equipment. The present invention may be configured for any size modular jack including 2, 4, 6 or 8 wire jacks.

14 Claims, 10 Drawing Figures

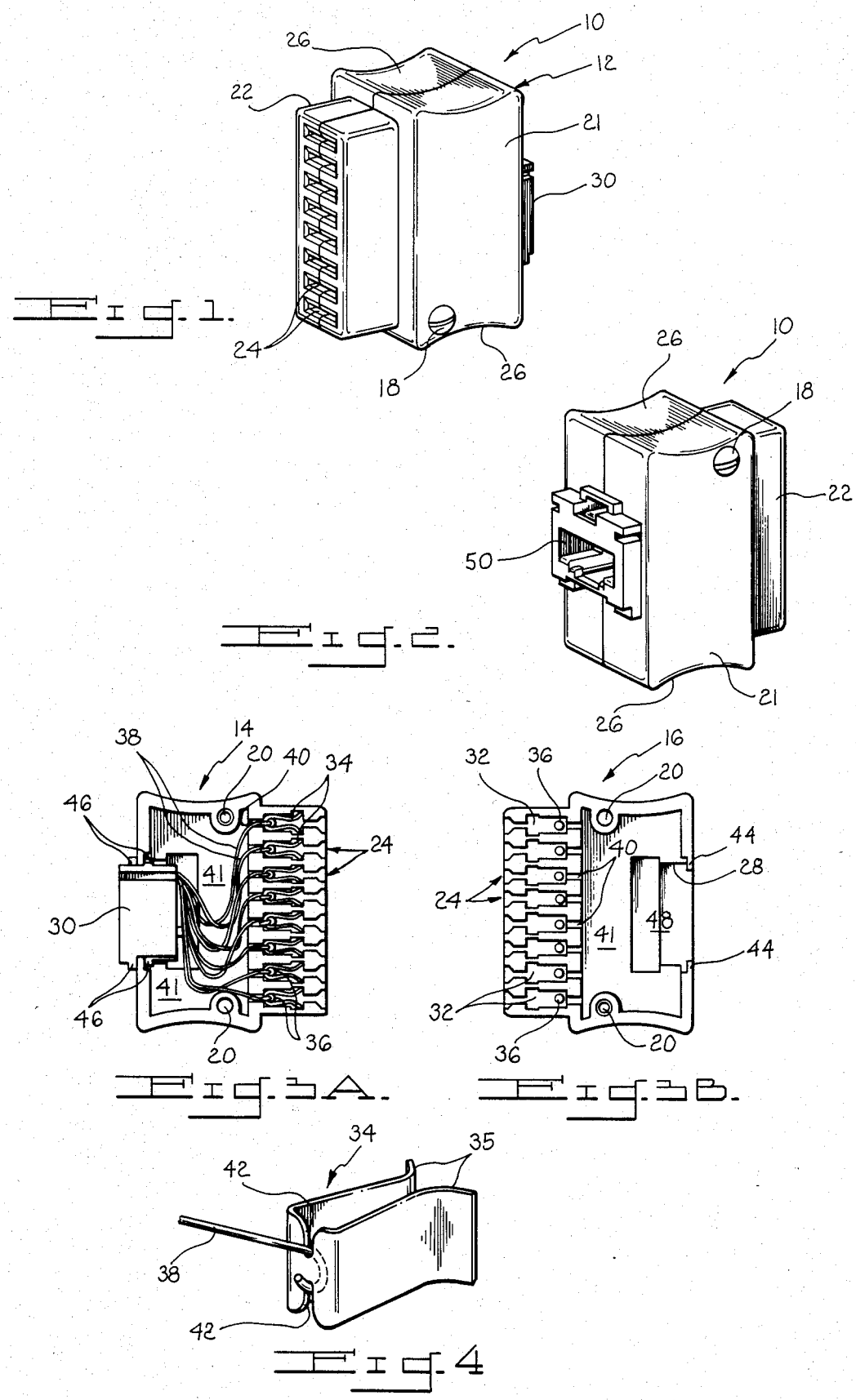

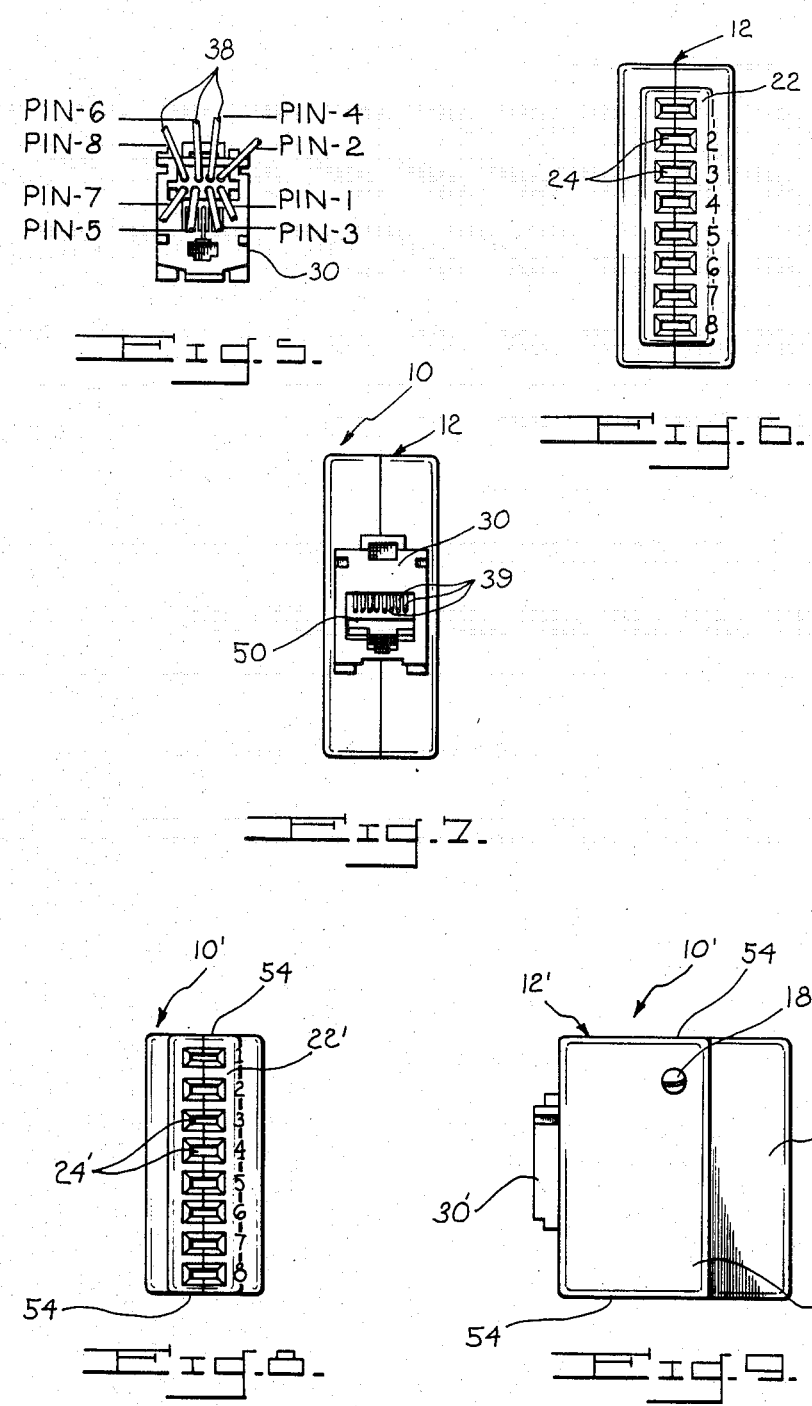

MODULAR TEST PLUG ADAPTER

BACKGROUND OF THE INVENTION

This invention relates to a modular test adapter device for use in the telephonic and related industries. More particularly, this invention relates to a new and improved test adapter for testing the wiring of a telephone terminal block of the type having a plurality of connectors extending therefrom such as, for example, type 66 terminals.

In the communications industry, and more particularly in the telephone industry, terminal blocks having a plurality of clip-type electrical connectors protruding therefrom are used. One such terminal block is the well known Type 66 quick connect block.

A typical prior art method of testing the connections in a terminal block is to attach the testing wires leading from the electronic testing apparatus to the electrical connectors of the block by clips, i.e., alligator clips. It should be appreciated that this is time consuming and is subject to human error. Thus, alligator clips of this type may create problems such as accidental shorting across terminals or intermittent test connections.

Another prior art test apparatus involves a test block which is the same size as the entire block to be tested. This test block has an array of contact elements that are force fitted over the connector elements of the terminal block, and the test block is then secured to the terminal block by clamping arms and a clamping screw. The arms extend into openings in the terminal block and the clamping screw is torqued through the arms to load the test block against the terminal block. This test apparatus is bulky and cumbersome, both to mount and dismount. Furthermore, because of the force fit of test contacts over the connector elements of the terminal block, contact can only be made with every other connector in a row because of space limitations. Thus, individual rows cannot be tested (the entire terminal block must be tested as a unit), and even then only half the connectors in any row are actually tested.

Still another prior art testing device is disclosed in U.S. Pat. No. 4,293,174, which is assigned to the assignee hereof and incorporated herein by reference. U.S. Pat. No. 4,293,174 describes a testing assembly comprising a plurality of pistons and piston rods within a plurality of chambers, each piston being connected to a conductive grommet and a resilient conductive spring. The assembly is then mounted on protruding connectors or terminals of the type hereinabove discussed via the chambers wherein electrical contact between the pistons and terminals is effected. However, while the testing device disclosed in U.S. Pat. No. 4,293,174 is suitable for its intended purposes, it does not easily afford interconnection with standardized modular plugs; and it must be held in place during use.

SUMMARY OF THE INVENTION

The above discussed and other problems of the prior art are overcome or alleviated by the modular test plug adapter of the present invention. In accordance with the present invention, a novel test adapter is provided for insertion directly on a telephone terminal block of the type having a plurality of connects extending therefrom such as, for example, a type 66 quick connect terminal block.

The test plug adapter of the present invention is comprised of a compact insulative housing having a plurality of apertures therethrough, the apertures leading into cavities capable of communicating with, for example, type 66 quick connect terminals. Each cavity within the housing of the adapter has means for retaining a bridge clip which firmly holds the bridge clip therein. The bridge clips are connected, via wire conductors, to a standard modular jack. Preferably, the bridge clip is the "quick connect" type which permits quicker and easier assembly and disassembly both in manufacturing and in the field.

Accordingly, when the test adapter of the present invention is mounted on the terminals of a connector block, the terminals are inserted through the apertures into the cavities wherein the bridge clips therein effect electrical and mechanical contact between the terminals of the block and the modular jack. Thereafter, a test phone or other test equipment adapter having a standard modular plug may be used in conjunction with the present invention.

It will be appreciated that the test adapter plug of the present invention may be configured for any size modular jacks including 2, 4, 6 or 8 wire modular jacks.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 1 is a front perspective view of a modular test plug adapter in accordance with the present invention.

FIG. 2 is a rear perspective view of the modular test plug adapter of FIG. 1.

FIG. 3A is a side elevation view of the modular test plug adapter of FIG. 1 with a portion of the housing removed.

FIG. 3B is a side elevation view of the removed portion of the housing from FIG. 3A.

FIG. 4 is an enlarged perspective view of a quick connect bridge clip and wire conductor from FIG. 3A.

FIG. 5 is a rear elevation view of a modular jack in accordance with the present invention.

FIG. 6 is a front elevation view of the modular test plug adapter of FIG. 1.

FIG. 7 is a rear elevation view of the modular test plug adapter of FIG. 1.

FIG. 8 is a front elevation view of an alternative embodiment of the modular test plug adapter of FIG. 1.

FIG. 9 is a side elevation view of the modular test plug adapter of FIG. 8.

DESCRIPTION OF THE PREFERRED EMBODIMENT

Referring jointly to FIGS. 1-3, a modular test plug adapter in accordance with the present invention is shown generally at 10. It will be appreciated that while an 8 wire modular jack test adapter 10 is shown in the FIGURES, the present invention may equally be configured for any size modular jack, including, but not limited to 2, 4 or 6 wire modular jacks.

The test adapter of the present invention is comprised of a housing 12 which preferably consists of two mirror image molded sections 14, 16 (shown in FIGS. 3A and 3B) joined together by screws 18 at screw holes 20. Alternatively, the section 14, 16 may be mated by any other suitable means, such as ultrasonic welding or the like. Housing 12 has a substantially rectangular base portion 21 having a plug ended nose 22 thereon. Plug ended nose 22 includes a plurality of apertures 24 which provide communication between the exterior and the interior of housing 12. As is shown in the figures, plug ended nose 22 has a width which is less than the width of base portion 21 while the length of nose 22 may be less than base portion 21 (FIG. 1) or equal to the length of base portion 21 (FIG. 8). It will be appreciated by those skilled in the art that the width of nose 22 is configured in accordance with the size of the terminals extending from a telephone terminal block. Note that base portion 21 of housing 12 includes indented or arcuate finger gripping areas 26 which aid in inserting or removing the present invention from a terminal block. Alternatively, base portion 21 of housing 12 may be flat topped to permit multiple stacking as will be discussed hereinafter with regard to FIGS. 8 and 9. Base portion 21 of housing 12 also includes a relatively large opening 28 suitable for retaining a standardized modular jack 30. Housing 12 is preferably comprised of a moldable insulating material such as any well known plastic material.

Referring now to FIGS. 3A and 3B, the interior of the test adapter of the present invention is shown. In FIGS. 3A and 3B, apertures 24 lead into cavities 32. Each cavity 32 preferably is configured to hold and retain an individual bridge clip 34 (FIG. 4). Accordingly, cavities 32 are wider at the end nearest apertures 24 so as to accept the divergent ends 35 of each bridge clip. Each cavity 32 also includes a cylindrical projection 36. Projections 36 and slot 40 act as a floor for wire conductors 38 when a bridging clip 34 is pushed down to make connection, and also provide a hard surface for an insertion tool (not shown) to bear against when wires 38 are cut as in FIG. 4. Projections 36 also act as a "stop" when connector terminals (not shown) are inserted into apertures 24 and through cavities 32. Wire conductors 38 lead from each bridge clip 34 to a well known standardized modular jack 30 wherein the conductors or wires 38 are connected to contact pins 39 (FIG. 7) within the modular jack 30. A chamber 41 is provided within housing 12 to accommodate the wires 38 and modular jack 30.

As shown in FIG. 4, each bridge clip 34 is provided with insulating stripping slots 42. The stripping slots 42, disposed across each other from at the top portion of clip 34 provide two connections for each wire conductor 38. In a preferred embodiment, the two connection points insure against possible poor shearing of insulation and poor contact. It will be appreciated that while two connection points have been shown in FIG. 4, bridge clip 34 may also include only one connection point. Bridge clip 34 has a well known construction which includes a pair of oppositely disposed arms connected at a base and extending therefrom. The extended arms converge to a point where they diverge and terminate at an entrance section. The bridge clips 34 provide a spring action closure for terminals (not shown) which are inserted between the divergent end or entrance 36 of the clips 34.

Bridge clips 34 are preferably of the "quick connect" type such as shown in the FIGURES. In the prior art, wire leads would be typically soldered or crimped to the a bridge clip. However, soldering or crimping may be undesirable from the standpoint of assembly and disassembly, especially in the field (i.e., by an installer or repairer). Accordingly, in accordance with a preferred embodiment of the present invention, a "quick connect" bridging clip 34 shown in FIG. 4 is utilized. Bridge clip 34 permits relatively quick connection between wire leads 38 and the clips 34. Bridge clip 34 also provide for easier assembly and disassembly both in manufacturing and in the field as wire leads 38 are easily removed from stripping slots 42.

Modular jack 30 is well known to those skilled in the art and therefore a detailed description thereof is unnecessary. However, it will be appreciated that the modular jack 30 shown in the FIGURES is an eight position modular jack. It is well known that the outer configuration of an eight position modular jack is different than the outer configuration of two, four or six position modular jacks. For example, a six position modular jack has a relatively smaller outer housing with distinct surface structure (as compared to an eight position jack) and will be approximately flush with housing 12 after insertion therein. This is in contrast to an eight position modular jack (see FIG. 2) which protudes outwardly from housing 12 at a relatively greater degree than would a six position modular jack (not shown). The distinctive and well known outer configuration of, for example, a six position modular jack will also necessitate a different means for retaining the jack in the housing relative to an eight position jack. It should be understood that the present invention includes any two, four, six or eight position modular jack positioned in a housing and having an adequate means for retaining the particular jack selected within the housing. Referring now to the FIGURES, opening 28 in housing 12 is provided with thinner wall portions 44 which communicate with jack 30 and slidably insert between a plurality of raised sections 46 thereon. Preferably, chamber 41 is provided with a stepped down region 48 thereby allowing additional space for modular jack 30.

Referring to FIG. 2, when the sections 14 and 16 of housing 12 shown in FIG. 3A and 3B are mated and attached, a well known standardized modular plug (not shown) may be easily inserted into the opening 50 in modular jack 30 thereby effecting electrical and mechanical contact therewith. Similarly, the eight apertures 24 on the plug nose 22 of housing 12 may be easily inserted onto telephonic or related terminals extending from a connector block, such as 66 type quick connect terminals. As each terminal is mounted on an aperture 24, the terminal then enters a cavity 32 wherein the spring action of a bridge clip 34 effects electrical and mechanical contact with the terminal. Thus, the test adapter of the present invention easily and quickly affords access between a terminal connector block and any standardized modular plug ended equipment, such as a test phone or other test equipment. The present invention is particularly well suited for use in conjunction with a modular adapter described in U.S. patent application Ser, No. 634,817, assigned to the assignee hereof and incorporated herein by reference.

As mentioned, with reference to FIGS. 8 and 9, in an alternative embodiment, housing 12' is provided with a planar of flat top base portion 54. This particular housing 12' configuration provides certain advantages over the housing 12 of FIG. 1 in that multiple test plug adapters 10' may be stacked in a butting relation along the same connector block. The accurate base portions 26 in FIG. 1 will impede such stacking and therefore a flat top structure as in FIGS. 8 and 9 may be preferable.

Referring now to FIGS. 5-7, and TABLE I below, the internal wiring configuration for two embodiments of the present invention are shown. In FIG. 5, a rear view of modular jack 30 is shown with the eight conductors 38 leading to an individual pin contact (FIG. 7) within the interior of the jack 30. FIG. 6 is a front view of the plug-ended nose of housing 12 with each aperture 28 being given an identity numeral 1-8. TABLE I below summarizes typical and preferred wiring configurations for two embodiments of the present invention:

TABLE I

|  | INTERNAL WIRING | |
|---|---|---|
|  | MODULAR JACK PIN NUMBER (FIG. 5) | TEST ADAPTER APERTURE NUMBER (FIG. 6) |
| FIRST EMBODIMENT | 5 | 1 |
|  | 4 | 2 |
|  | 3 | 3 |
|  | 6 | 4 |
|  | 2 | 5 |
|  | 7 | 6 |
|  | 1 | 7 |
|  | 8 | 8 |
| SECOND EMBODIMENT | 5 | 1 |
|  | 4 | 2 |
|  | 1 | 3 |
|  | 2 | 4 |
|  | 3 | 5 |
|  | 6 | 6 |
|  | 7 | 7 |
|  | 8 | 8 |

By example, in a first embodiment, the bridge clip 34 disposed behind aperture 1 will be wired or connected to pin contact 5 in the modular jack 30. Clearly, any other suitable wiring configuration may also be used in accordance with the present invention. It will be appreciated that because the two mated sections of the housing 17 are detachably screwed, than a repairman or installer in the field may easily effect rearrangement of the wiring simply by removing and repositioning the bridge clips 34. This is an important feature of the present invention in terms of design flexibility and adaptation.

The modular test plug adapter of the present invention provides many features and improvements relative to the prior art. The adapter 10 easily and rapidly tests connections directly on, for example, a 66 type terminal on a quick connect block. The present invention inserts directly onto the 66 terminals of the block in a simple, straight forward one handed action. Both hands of the technician are then free to test, check connections, dress wiring, etc. The present invention eliminates possible problems associated with handling alligator clips or test probes such as accidental shorting across terminals or intermittent test connections.

The test adapter in accordance with the present invention can be provided with a 2, 4, 6 or 8 wire modular jack (i.e., 1, 2, 3 or 4 pair wire) into which a test phone or test equipment adapter may be inserted.

As mentioned, the housing 17 of the test adapter 10 is preferably comprised of two identical mated sections which, along with the limited number of well known component parts, provides low cost and ease of manufacturing. This feature also permits quick and easy rearrangement and repositioning of the internal wiring by rearranging the bridge clips 34.

It is again reemphasized that while a 4 pair (8 wire) test adapter has been shown and described, adapters having greater or lesser pairs of wires, for example 1, 2, or 3 pair wire adapters, are similarly included by the present invention.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A modular test adapter which is adapted to electrically and mechanically connect onto a plurality of terminals extending from a telephone terminal block, comprising:

an electrically insulating housing, said housing having a base portion and a nose portion, said nose portion having a width dimension which is less than the width dimension of said base portion, said nose portion having a plurality of apertures extending in a line which is substantially perpendicular to said nose portion width dimension, said apertures connecting the outside of said housing with the inside of said housing, each of said apertures leading to a cavity;

female bridge clip means, said clip means being disposed, one in each of said cavities, said bridge clip means being adapted to surroundingly receive a terminal from the terminal block and effect electrical and mechanical connection therewith;

modular jack means, said modular jack means being retained within an opening in said base portion of said housing, said modular jack means having contact pins therein, that portion of the modular jack means that is within the adapter being within the wider width dimension region of the base portion; and conductor means electrically and mechanically connected between said bridge clip means and said modular jack contact pins.

2. The adapter of claim 1 including:
means for retaining said bridge clip means within said housing.

3. The adapter of claim 1 including:
projection means in said cavities.

4. The adapter of claim 1 wherein said housing includes:
internal grooves for retaining a portion of said conductor means.

5. The adapter of claim 1 wherein said housing includes:
an inside chamber for holding a portion of said conductor means and retaining said modular jack means.

6. The adapter of claim 5 wherein said chamber further includes a recessed region which communicates with a portion of said modular jack means.

7. The adapter of claim 1 wherein said housing opening includes:
means to retain said modular jack means.

8. The adapter of claim 1 wherein said housing is comprised of two identical sections.

9. The adapter of claim 8 including:
means for mating said identical sections.

10. The adapter of claim 9 wherein said mating means includes:
at least one screw, said screw cooperating with a pair of screw holes through said two housing sections.

11. The adapter of claim 1 including:

at least one arcuate gripping section on the outside of said housing.

12. The adapter of claim 1 wherein:

said housing includes top and bottom surfaces and wherein:

said top and bottom surfaces are flat.

13. The adapter of claim 1 wherein said bridge clip means comprises:

a pair of oppositely disposed arms connected at a base and extending therefrom, said extended arms converging to a point whereupon said arms diverge and terminate at an entrance section, said entrance section being adapted to receive a terminal from the terminal block and effect electrical and mechanical connection therewith.

14. The adapter of claim 13 wherein said base of the bridge clip includes at least one stripping slot.

* * * * *